US010151033B2

(12) United States Patent
Sato et al.

(10) Patent No.: US 10,151,033 B2
(45) Date of Patent: Dec. 11, 2018

(54) PLASMA CHEMICAL VAPOR DEPOSITION DEVICE

(71) Applicant: TOYOTA JIDOSHA KABUSHIKI KAISHA, Toyota-shi, Aichi-ken (JP)

(72) Inventors: Yoji Sato, Kasugai (JP); Takayasu Sato, Takahama (JP); Hiromichi Nakata, Toyota (JP); Kazutaka Tachibana, Nagoya (JP); Osamu Ariyada, Tokyo (JP); Yuji Takano, Noda (JP); Ryo Tsurumoto, Tokyo (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 297 days.

(21) Appl. No.: 15/188,154

(22) Filed: Jun. 21, 2016

(65) Prior Publication Data

US 2016/0376707 A1 Dec. 29, 2016

(30) Foreign Application Priority Data

Jun. 24, 2015 (JP) ................................. 2015-126806

(51) Int. Cl.
*C23C 16/513* (2006.01)
*H01J 37/32* (2006.01)
*C23C 16/455* (2006.01)

(52) U.S. Cl.
CPC .......... *C23C 16/513* (2013.01); *C23C 16/455* (2013.01); *H01J 37/32211* (2013.01); *H01J 37/32311* (2013.01); *H01J 37/32577* (2013.01)

(58) Field of Classification Search
CPC .......... H01J 37/32192; H01J 37/32201; H01J 37/32211; H01J 37/3222; H01J 37/32229; H01J 37/32238
See application file for complete search history.

(56) References Cited

U.S. PATENT DOCUMENTS

| 4,434,742 A * | 3/1984 | Henaff | B01J 19/08 |
| | | | 118/50.1 |
| 2006/0005930 A1* | 1/2006 | Ikeda | H01J 37/32431 |
| | | | 156/345.51 |
| 2012/0067523 A1* | 3/2012 | Kasai | H01J 37/32192 |
| | | | 156/345.41 |

FOREIGN PATENT DOCUMENTS

| JP | 2003171785 A | 6/2003 |
| JP | 2004047207 A | 2/2004 |

OTHER PUBLICATIONS

Tanaka, Takeshi, et. al, "Improvement of the Hydrogen Plasma Durability of SN02 Surface by Using RF-DC Coupled Power Supply.", Research Bulletin of the Hiroshima Institute of Technology, vol. 29, pp. 29-33, (1995).

* cited by examiner

*Primary Examiner* — Joseph A Miller, Jr.
(74) *Attorney, Agent, or Firm* — Oliff PLC

(57) ABSTRACT

A plasma chemical vapor deposition device includes a chamber, a first conductor having an elongated shape, a second conductor having a tubular shape, a high-frequency output device, and a direct-current power supply. A first connecting portion of the first conductor with the high-frequency output device and a second connecting portion of the first conductor with the direct-current power supply are both placed outside the chamber. A distance from one end of the first conductor to the first connecting portion is shorter than a distance from the one end of the first conductor to the second connecting portion. An impedance change portion is provided between the first connecting portion and the second connecting portion in the first conductor, the impedance change portion having an impedance different from an impedance between the one end of the first conductor and the first connecting portion.

7 Claims, 3 Drawing Sheets

PLASMA CHEMICAL VAPOR DEPOSITION DEVICE

INCORPORATION BY REFERENCE

The disclosure of Japanese Patent Application No. 2015-126806 filed on Jun. 24, 2015 including the specification, drawings and abstract is incorporated herein by reference in its entirety.

BACKGROUND OF THE INVENTION

1. Field of the Invention

The present invention relates to a plasma chemical vapor deposition device that deposits a film on a workpiece by inputting a microwave into the workpiece.

2. Description of Related Art

Research bulletin of the Hiroshima Institute of Technology, Vol. 29 (1995) pp. 29 to 33 discloses one example of a plasma chemical vapor deposition device (hereinafter also referred to as a "PCVD device") that deposits a film on a workpiece by inputting RF into the workpiece in a state where the RF is offset by a direct voltage. The RF is a wave having a wavelength of around 13.56 MHz. Note that the "RF" is an abbreviation of "Radio Frequency."

The PCVD device includes a conductor that makes contact with the workpiece inside a chamber, an RF output device that outputs RF, and a direct-current power supply. The RF output device and the direct-current power supply are both connected to the conductor outside the chamber. Hereby, the RF thus offset by the direct voltage can be directly input into the workpiece via the conductor. When the RF is input into the workpiece, a process gas supplied into the chamber is turned into plasma and decomposed around the workpiece, so that a film is deposited on a surface of the workpiece.

Further, in the PCVD device, when a connecting portion of the conductor with the RF output device is assumed a first connecting portion and a connecting portion of the conductor with the direct-current power supply is assumed a second connecting portion, the first connecting portion is placed closer to the workpiece than the second connecting portion. In this case, the RF flows through the conductor not only from the first connecting portion toward a workpiece side but also from the first connecting portion toward a second-connecting-portion side. Accordingly, a lowpass filter is provided in the conductor between the first connecting portion and the second connecting portion. The lowpass filter restrains leakage of the RF toward a direct-current-power-supply side. Note that such a lowpass filter for the RF can be constituted by a lumped constant circuit including electronic components such as a resistor and a capacitor.

In the meantime, as described in Japanese Patent Application Publication No. 2004-47207 A (JP 2004-427207 A), for example, the following method is well known: a microwave having a frequency higher than the RF is input into a workpiece so as to deposit a film on the workpiece. In a case where the microwave is directly input into the workpiece while a direct voltage is applied to the workpiece through a conductor, the RF output device in the PCVD device is replaced with a microwave output device for outputting a microwave. Further, another tubular conductor placed coaxially with the conductor is provided so as to restrain the microwave flowing through a surface of the conductor toward the workpiece from leaking outside halfway. Consequently, the microwave can be directly input into the workpiece, a potential of which is changed by application of the direct voltage.

SUMMARY OF THE INVENTION

In a case where the PCVD device is configured such that the microwave is directly input into the workpiece while the direct voltage is applied to the workpiece through the conductor as described above, the microwave also flows through the surface of the conductor from the first connecting portion toward a second-connecting-portion side. On this account, a mechanism for restraining leakage of the microwave toward a direct-current-power-supply side is provided between the first connecting portion and the second connecting portion in the conductor.

However, since the microwave has a very high frequency, it is difficult to design a lowpass filter for a microwave, differently from the lowpass filter for RF. That is, a lowpass filter for a high-frequency microwave should be designed with a distributed constant circuit to be formed in consideration of a resistance or the like of a wiring line that can be ignored in the lumped constant circuit. However, it is difficult to set or manufacture a distributed constant circuit with high precision.

The present invention provides a plasma chemical vapor deposition device that can restrain leakage of a microwave toward a direct-current-power-supply side at the time when a film is deposited on a workpiece by inputting a microwave into the workpiece while a direct voltage is applied to the workpiece.

A plasma chemical vapor deposition device according one aspect of the present invention includes a chamber, a first conductor having an elongated shape, a second conductor having a tubular shape, a high-frequency output device, and a direct-current power supply. The chamber is configured to accommodate a workpiece inside the chamber. The chamber is configured to decompose a process gas by turning the process gas into plasma inside the chamber such that a film is deposited on the workpiece. The first conductor is configured such that one end makes contact with the workpiece inside the chamber and the other end is placed outside the chamber. The second conductor is placed coaxially with the first conductor such that the first conductor is placed inside the second conductor. The high-frequency output device is connected to the first conductor and the second conductor. The high-frequency output device is configured to cause a microwave to flow through a surface of the first conductor. The direct-current power supply is configured to output a direct voltage to the first conductor. A first connecting portion of the first conductor with the high-frequency output device and a second connecting portion of the first conductor with the direct-current power supply are both placed outside the chamber. A distance from the one end of the first conductor to the first connecting portion is shorter than a distance from the one end of the first conductor to the second connecting portion. An impedance change portion is provided between the first connecting portion and the second connecting portion in the first conductor, the impedance change portion having an impedance different from an impedance between the one end of the first conductor and the first connecting portion.

According to the plasma chemical vapor deposition device of the above aspect, when a direct voltage is applied to the first conductor, a direct current flowing through the first conductor is input into the workpiece, so that a potential of the workpiece is changed. Further, the microwave output from the high-frequency output device flows through the surface of the first conductor so as to be input into the chamber. As a result, the process gas supplied into the chamber is decomposed by the microwave, and ions generated by the decomposition of the process gas are adsorbed to the workpiece, the potential of which is changed by the direct current. Hereby, it is possible to efficiently deposit a film on the workpiece.

Note that the microwave output from the high-frequency output device toward the first connecting portion flows through the surface of the first conductor not only from the first connecting portion toward a workpiece side but also from the first connecting portion toward a second-connecting-portion side.

Here, the microwave has a very high frequency. Therefore, when the conductor to which the high-frequency output device is connected has a part where an impedance is changed, the microwave is reflected by the part, thereby making it difficult for the microwave to flow toward a downstream side relative to the part.

In view of this, the above configuration has focused on such a feature of the microwave, and a part of the first conductor between the first connecting portion and the second connecting portion is provided as an impedance change portion having an impedance different from an impedance on a first-connecting-portion side. Accordingly, the microwave flowing through the surface of the first conductor from the first connecting portion toward the second-connecting-portion side is reflected by the impedance change portion, thereby making it difficult for the microwave to flow on the second-connecting-portion side relative to the impedance change portion. Accordingly, at the time when a film is deposited on the workpiece by inputting the microwave into the workpiece while a direct voltage is applied to the workpiece, it is possible to restrain the microwave from leaking toward the direct-current-power-supply side.

In the meantime, when a microwave output from the high-frequency output device to the first connecting portion and flowing through the surface of the first conductor from the first connecting portion is assumed an output wave and a microwave reflected by the impedance change portion is assumed a reflected wave, the output wave from the high-frequency output device is combined with the reflected wave at the first connecting portion. A synthetic wave thus synthesized is input into the workpiece to which the direct voltage is applied. At this time, if an amplitude of the synthetic wave input into the workpiece is small, it is difficult to turn the process gas into plasma inside the chamber, and eventually, efficiency of film deposition on the workpiece easily decreases. That is, in order to increase the efficiency of film deposition on the workpiece, it is desirable to increase the amplitude of the wave to be input into the workpiece as much as possible.

In view of this, in the plasma chemical vapor deposition device of the above aspect, the impedance change portion may be provided at a change position in the first conductor, the change position being a position distanced from the first connecting portion toward a second-connecting-portion side only by a prescribed distance. Note that, when a wavelength of the output wave output from the high-frequency output device is "λ," "n" is an integer number larger than "0 (zero)," and the prescribed distance is "D," the prescribed distance may satisfy the following relational expression:

$$D = \left(n + \frac{1}{4}\right) \times \lambda \qquad \text{Math. 1}$$

According to the plasma chemical vapor deposition device of the above aspect, the reflected wave is a wave shifted by a half cycle from the output wave from the high-frequency output device. Accordingly, an amplitude of the synthetic wave obtained by combining the reflected wave with the output wave can be increased to be larger than an amplitude of the output wave from the high-frequency output device. This makes it possible to restrain leakage of the microwave toward the direct-current-power-supply side and to improve efficiency of film deposition on the workpiece.

In the meantime, an example of a method to change an impedance of a part of the first conductor is a method in which an annular groove is provided in a part of the first conductor so as to decrease a diameter of the part. This method is called a choke structure. In a case where a diameter of the first conductor at the change position is decreased so that the microwave is reflected at the change position, it is desirable that a depth of the groove be "(λ/4)+(m·λ/2)." Note that "m" is an integer number of "0 (zero)" or more. In this case, it is necessary to employ, as the first conductor, a conductor having a diameter that makes it possible to provide a groove with such a depth.

In contrast, in a case where an impedance is changed by increasing the diameter of the first conductor at the change position, a groove is not provided at the change position. On this account, it is possible to employ, as the first conductor, a conductor having a relatively small diameter.

In view of this, in the plasma chemical vapor deposition device of the above aspect, the impedance change portion may be configured such that a diameter of the first conductor at the change position is made larger than a diameter thereof on the first-connecting-portion side relative to the change position. According to this aspect, even if the conductor with a relatively small diameter is employed as the first conductor, the impedance change portion can be provided in the first conductor. That is, limitations on a size and a shape of a member to be employed as the first conductor can be reduced.

Further, in the plasma chemical vapor deposition device of the above aspect, another impedance change portion having an impedance different from an impedance on a first-connecting-portion side may be provided between the change position and the second connecting portion in the first conductor. According to this aspect, a microwave that passes through the impedance change portion placed at the change position to flow toward the second connecting portion without being reflected by the impedance change portion toward the first-connecting-portion side can be reflected by the another impedance change portion. Thus, when a plurality of portions that reflects the microwave toward the first-connecting-portion side is provided between the first connecting portion and the second connecting portion, it is possible to increase an effect of restraining the microwave from leaking toward the direct-current-power-supply side.

Further, in the plasma chemical vapor deposition device of the above aspect, the another impedance change portion may be a flange provided in the first conductor. A plurality of another impedance change portions may be provided between the change position and the second connecting portion. An earth electrode may be provided between the another impedance change portions adjacent to each other in an axial direction extending from the one end of the first conductor to the second connecting portion, the earth electrode being a grounded electrode.

According to this aspect, the direct current flows through the another impedance change portions, which forms a state where a plurality of capacitors is placed in the axial direction. By placing the plurality of capacitors along the axial direction as such, it is possible to more effectively restrain the microwave passing through the impedance change portion and flowing toward the second connecting portion from flowing toward the second-connecting-portion side.

In the plasma chemical vapor deposition device of the above aspect, the first conductor may be a hollow structure having an internal space. A temperature sensor configured to detect a temperature of the workpiece making contact with the first conductor may be placed in the internal space of the first conductor. According to this aspect, the temperature of the workpiece inside the chamber can be detected by the temperature sensor. On that account, at the time of depositing a film, it is possible to control the device based on the temperature of the workpiece.

In the plasma chemical vapor deposition device of the above aspect, in a case where the first conductor is a hollow structure having an internal space, the internal space of the first conductor may constitute a part of a supply passage through which the process gas is supplied to the chamber. In this case, the first conductor may include a communication portion that communicates the internal space of the first conductor with the chamber. According to this aspect, since the communication portion of the first conductor serves as a supply port of the process gas to the chamber, the supply port can be placed near the workpiece. On that account, inside the chamber, a concentration of the process gas easily increases near the workpiece as a processing object. This consequently makes it possible to improve efficiency of film deposition on the workpiece.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
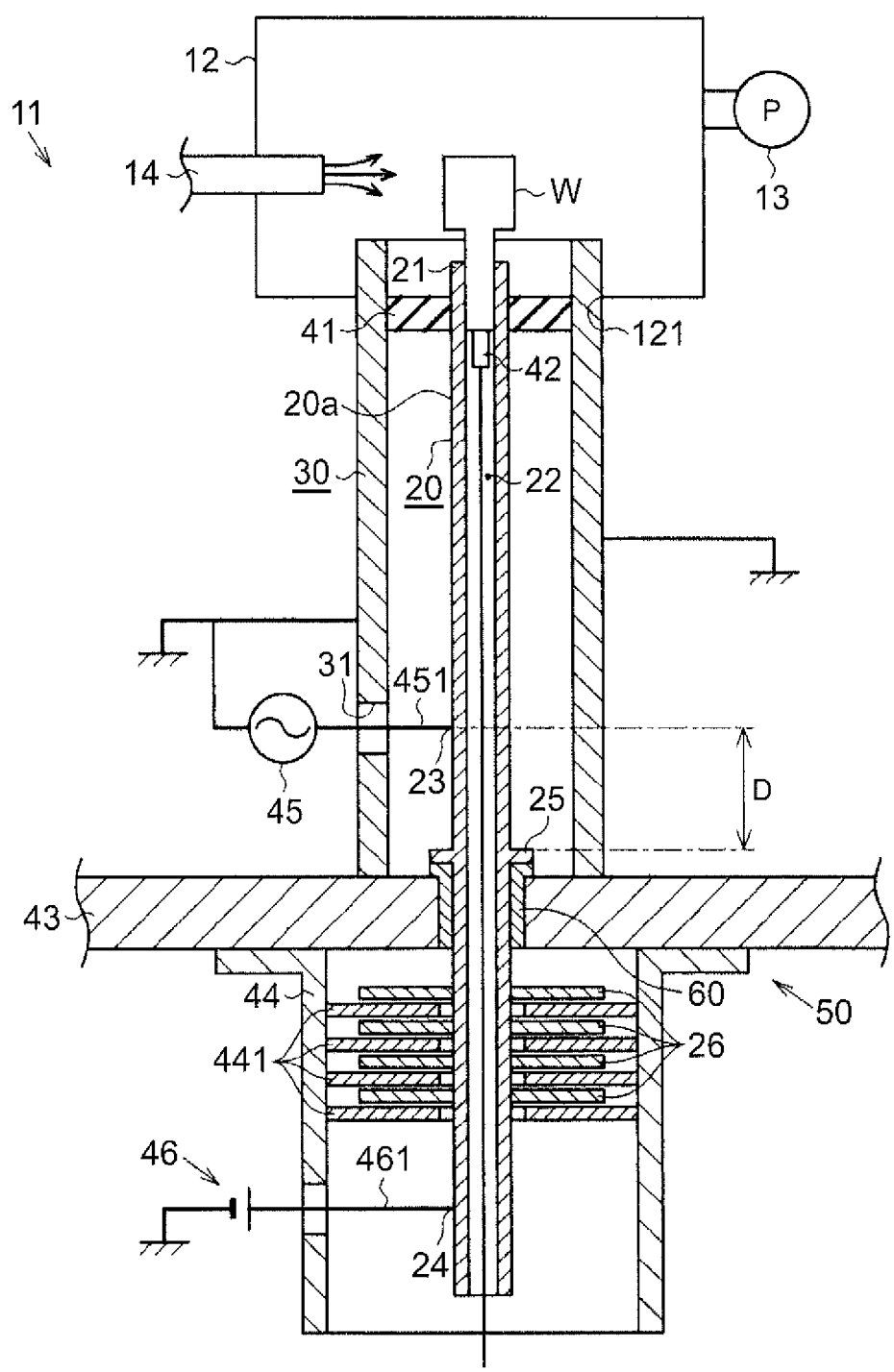
FIG. 1 is a sectional view schematically illustrating one embodiment of a plasma chemical vapor deposition device.
Figure 2:
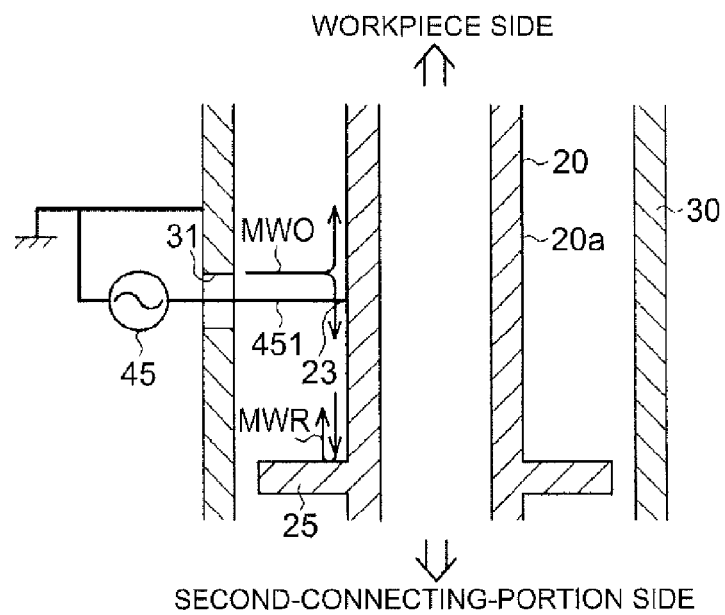
FIG. 2 is an operational view illustrating a state where a microwave flowing from a first connecting portion toward a second connecting portion is reflected by an impedance change portion.
Figure 3:
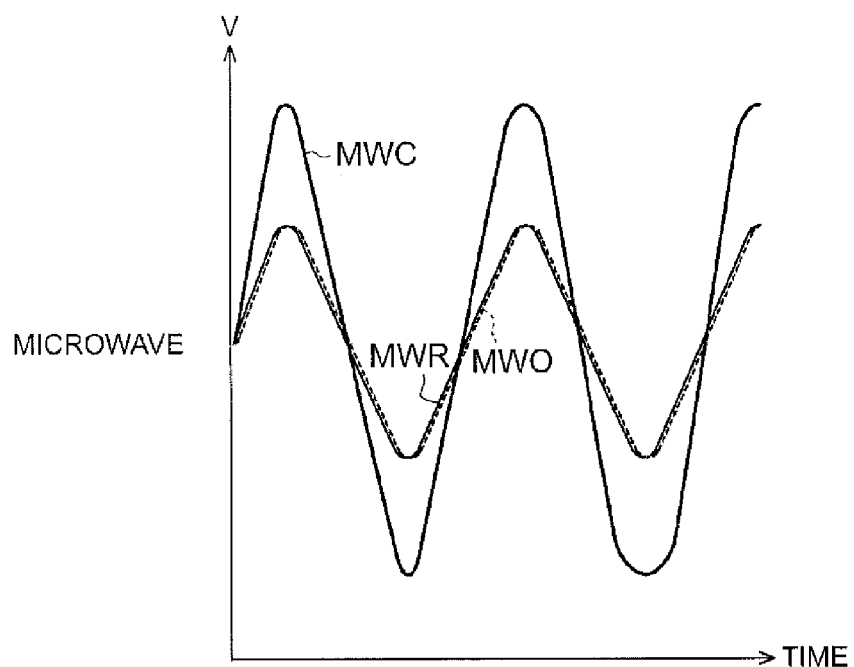
FIG. 3 is a view illustrating a state where a microwave output from a high frequency output device to the first connecting portion is combined with a microwave reflected by the impedance change portion.

The following described one embodiment that embodies a plasma chemical vapor deposition device, with reference to FIGS. 1 to 3. As illustrated in FIG. 1, a plasma chemical vapor deposition device 11 of the present embodiment includes: a chamber 12 in which a workpiece W made of a conductive material such as metal is set; a vacuum pump 13 that forms a vacuum atmosphere inside the chamber 12; and a gas supply pipe 14 that supplies a process gas into the chamber 12. In the present specification, the plasma chemical vapor deposition device is also referred to as a "PCVD device."

Further, the PCVD device 11 is provided with a first conductor 20 having an elongated shape and extended in an axial direction, which is an up-down direction in the figure, and a tubular second conductor 30 placed on an outer peripheral side relative to the first conductor 20 and placed coaxially with the first conductor 20. The first conductor 20 has a tubular shape, and an outside diameter of the first conductor 20 is smaller than an inside diameter of the second conductor 30. Accordingly, a space is formed between an inner surface of the second conductor 30 and an outer surface 20a of the first conductor 20. Further, a sealing member 41 is placed between the second conductor 30 and the first conductor 20. The sealing member 41 restricts an afflux of the air into the chamber 12. An inner peripheral surface of the sealing member 41 makes close contact with the outer surface of the first conductor 20, and an outer peripheral surface of the sealing member 41 makes close contact with the inner surface of the second conductor. Note that the sealing member 41 is made of a material that allows a microwave to pass therethrough.

An upper end in the figure as a distal end of the first conductor 20 is a support portion 21 that directly supports the workpiece W inside the chamber 12. An internal space 22 of the first conductor 20 is opened at the support portion 21. The opening thus formed at the support portion 21 is closed by the workpiece W supported by the support portion 21. Note that a temperature sensor 42 that makes contact with the workpiece W supported by the support portion 21 so as to detect a temperature of the workpiece W is provided in the internal space 22 of the first conductor.

The second conductor 30 is grounded, and a potential of the second conductor 30 is "0 (zero) V." An upper end in the figure as one end of the second conductor 30 enters the chamber 12 through an opening 121 formed in the chamber 12. Further, a lower end in the figure as the other end of the second conductor 30 is supported by a base 43. Note that the base 43 supports a tubular body 44 extending downward in the figure from the base 43. An inside diameter of the tubular body 44 is larger than the inside diameter of the second conductor 30. The tubular body 44 is placed on a radially outer side relative to the first conductor 20 placed on a lower side in the figure relative to the base 43.

Further, the PCVD device 11 is provided with a high-frequency output device 45 for outputting a microwave, and a direct-current power supply 46 for outputting a direct voltage. The high-frequency output device 45 is provided with an output portion 451 for outputting a microwave, and the output portion 451 extends rightward in the figure. The output portion 451 is connected to the first conductor 20 such that the output portion 451 passes through a through-hole 31 provided in the second conductor 30 without making contact with the second conductor 30. In the first conductor 20, a part to which the output portion 451 of the high-frequency output device 45 is connected is referred to as a "first connecting portion 23." A microwave output to the first connecting portion 23 flows through the outer surface 20a, which is a surface of the first conductor 20. The surface of the first conductor 20 is opposed to the inner surface of the second conductor 30 via a space. At this time, the second conductor 30 restrains the microwave flowing through the outer surface 20a of the first conductor 20 from leaking outside the device.

Further, the direct-current power supply 46 is provided with an output portion 461 for outputting a direct voltage.

The output portion 461 is connected to the first conductor 20. In the first conductor 20, a part to which the output portion 461 of the direct-current power supply 46 is connected is referred to as a "second connecting portion 24." In this case, the second connecting portion 24 is placed farther from the support portion 21 than the first connecting portion 23.

In the PCVD device 11 of the present embodiment, when a direct voltage is applied to the first conductor 20, a negative direct current flows through the first conductor 20. Such a direct current also flows through the workpiece W supported by the first conductor 20. On this account, the potential of the workpiece W changes to a negative side.

When a microwave MW is output from the high-frequency output device 45 under a state where the direct current flows through the workpiece W, the microwave MW flows through the outer surface 20a of the first conductor 20. Then, the microwave MW is directly input into the workpiece W, the potential of which changes to the negative side.

In the meantime, as illustrated in FIG. 2, when a microwave output from the high-frequency output device 45 is assumed an "output wave MWO," the output wave MWO flows not only toward the workpiece W placed on an upper side in the figure, but also toward the second connecting portion 24 placed on a lower side in the figure.

In view of this, as illustrated in FIG. 1, a leakage prevention portion 50 is provided between the first connecting portion 23 and the second connecting portion 24 in the first conductor 20. The leakage prevention portion 50 restrains the output wave MWO from leaking to the direct-current power supply 46. When a position distanced only by a prescribed distance from the first connecting portion 23 toward a second-connecting-portion-24 side is assumed a change position, the leakage prevention portion 50 includes a first flange 25 serving as an impedance change portion placed at the change position.

Note that, when a wavelength of the output wave MWO is "λ," "n" is an integer number of "0 (zero)" or more, and a prescribed distance is "D," the prescribed distance D can be expressed by the following relational expression.

$$D = \left(n + \frac{1}{4}\right) \times \lambda \qquad \text{Math. 2}$$

An outside diameter of the first flange 25 is larger than an outside diameter of the first conductor 20 on a first-connecting-portion-23 side (the upper side in the figure) relative to the change position. The first flange 25 does not make contact with the second conductor 30. That is, the impedance change portion is configured such that a diameter of the first conductor 20 at the change position is made larger than a diameter thereof on the first-connecting-portion-23 side relative to the change position. This allows the first conductor 20 to have different impedances at the change position and on the first-connecting-portion-23 side relative to the change position. As a result, the output wave MWO flowing through the outer surface 20a of the first conductor 20 from the first connecting portion 23 toward a second-connecting-portion-24 side is reflected by the first flange 25 so as to be returned back toward the first-connecting-portion-23 side. Note that the first conductor 20 having the first flange 25 is supported by the base 43 via an insulator 60.

However, even if the first flange 25 is provided at the change position as such, the microwave flowing from the first connecting portion 23 toward the second connecting portion 24 may partially pass through the first flange 25 to flow through the first conductor 20 toward the second connecting portion 24. On this account, second flanges 26 are provided between the first flange 25 and the second connecting portion 24 in first conductor 20. The second flanges 26 serve as another impedance change portions larger than the outside diameter of the first conductor 20 on the first-connecting-portion-23 side. In the example illustrated in FIG. 1, a plurality of second flanges 26 is placed intermittently along the up-down direction, which is the axial direction in the figure. Note that an outside diameter of each of the second flanges 26 may be equal to the outside diameter of the first flange 25 or may be larger than the outside diameter of the first flange 25.

Further, the tubular body 44 supports a plurality of earth electrodes 441 that is grounded. The earth electrodes 441 have an annular shape, and the number of earth electrodes 441 provided herein is the same as the number of second flanges 26. The second flanges 26 and the earth electrodes 441 are placed alternately along the axial direction. That is, a plurality of capacitors is formed to be placed between the first flange 25 and the second connecting portion 24 in the axial direction. Hereby, the output wave MWO passing through the first flange 25 is reflected by the capacitors constituted by the second flanges 26 and the earth electrodes 441, so that the output wave MWO is returned back to the upper side in the figure (that is, a direction distanced from the second connecting portion 24).

Referring now to FIGS. 2, 3, the following describes an operation of the PCVD device 11 of the present embodiment. In a state where the workpiece W is supported by the support portion 21 of the first conductor 20 inside the chamber 12, the output wave MWO is output from the high-frequency output device 45 to the first connecting portion 23, and a direct voltage DV is supplied from the direct-current power supply 46 to the first conductor 20. Consequently, a negative current flows into the workpiece W, so that a potential of the workpiece W is lowered. Further, the output wave MWO output to the first connecting portion 23 flows through the outer surface 20a of the first conductor 20. However, in the outer surface 20a of the first conductor 20, not only the output wave MWO flows from the first connecting portion 23 toward the workpiece W, but also the output wave MWO flows from the first connecting portion 23 toward the second-connecting-portion-24 side. At this time, the output wave MWO flowing toward the second connecting portion 24 is reflected by the first flange 25, so as to be returned back toward the first-connecting-portion-23 side, as illustrated in FIG. 2. The microwave thus reflected back by the first flange 25 is referred to as a "reflected wave MWR."

As a result, the output wave MWO supplied from the first connecting portion 23 to the first conductor 20 is combined with the reflected wave MWR at the first connecting portion 23. A synthetic wave MWC synthesized as such flows toward the workpiece W.

Incidentally, the first flange 25 is provided at the change position distanced from the first connecting portion 23 toward the second-connecting-portion-24 side only by the prescribed distance D. Accordingly, the reflected wave MWR is shifted by a "half" cycle from the output wave MWO from the first connecting portion 23. As a result, as illustrated in FIG. 3, the output wave MWO is amplified by the reflected wave MWR at the first connecting portion 23. That is, an amplitude of the synthetic wave MWC becomes larger than an amplitude of the output wave MWO from the first connecting portion 23. For example, in a case where the amplitude of the synthetic wave MWC is at the same level as the amplitude of the output wave MWO, the amplitude of the synthetic wave MWC is about double the amplitude of the output wave MWO from the first connecting portion 23.

Such a synthetic wave MWC is input into the workpiece W. Hereby, the process gas is turned into plasma and decomposed inside the chamber 12, so that a film is deposited on the surface of the workpiece W. Here, a method that uses a waveguide rather than the first conductor 20 is also known as a method for supplying a workpiece with a microwave. In such a configuration, a dielectric material is provided between a distal end of the waveguide and a workpiece W. In this case, a microwave flows through an outer layer of the dielectric material so as to be input into the workpiece W. Because of this, a film is deposited not only on a surface of the workpiece W but also on the outer layer of the dielectric material. As a result, a resistance value of the dielectric material changes, which may cause a decrease in a speed of film deposition on the workpiece W and a decrease in hardness of a deposited film.

Further, at the time when the microwave is input into the workpiece W via the dielectric material, heat is generated in the dielectric material due to the microwave flowing through the outer layer of the dielectric material and the process gas is turned into plasma in the outer layer of the dielectric material. This may result in that the microwave is damped by the dielectric material and an input amount of the microwave into the workpiece W decreases. On that account, a high-power device is necessary as the high-frequency output device. Further, depending on a material of the workpiece W, a temperature of the workpiece W also increases due to a temperature rise by the heat generation of the dielectric material, which may cause a decrease in a speed of film deposition on the workpiece W.

In contrast, the PCVD device 11 of the present embodiment uses the conductor (that is, the first conductor 20 and the second conductor 30) rather than the waveguide, so the microwave can be directly input into the workpiece W through the outer surface 20a of the first conductor 20 without passing through the dielectric material. This accordingly restrains variations in accuracy of film deposition on the workpiece W. Further, since a difference between an output amount of the microwave from the high-frequency output device and an input amount of the microwave into the workpiece W is decreased, a low power of the high-frequency output device and a temperature rise of the workpiece W can be also restrained.

According to the configuration and the operation described above, the following effects can be obtained. (1) In the PCVD device 11 of the present embodiment, the first flange 25 is provided in a part of the first conductor 20 between the first connecting portion 23 and the second connecting portion 24, and a part where an impedance changes is formed between the first connecting portion 23 and the second connecting portion 24 in the first conductor 20. As a result, the output wave MWO flowing through the outer surface 20a of the first conductor 20 from the first connecting portion 23 toward the second-connecting-portion-24 side is reflected by the first flange 25, thereby making it difficult for the output wave MWO to flow toward the second-connecting-portion-24 side relative to the first flange 25. Accordingly, at the time when a film is deposited on the workpiece W by inputting the microwave into the workpiece W while the direct voltage DV is applied to the workpiece W, it is possible to restrain the microwave from leaking toward the direct-current-power-supply-46 side.

(2) The first flange 25 is provided at the change position of the first conductor 20. Accordingly, by combining the output wave MWO with the reflected wave MWR reflected by the first flange 25, the synthetic wave MWC having a larger amplitude than that of the output wave MWO can be input into the workpiece W. This consequently makes it possible to improve efficiency of film deposition on the workpiece W.

(3) As a method to change an impedance at a part of the first conductor 20, there is such a method in which an annular groove is provided in a part of the first conductor 20 so as to decrease a diameter of the part. This method is called a choke structure. In such a choke structure, in a case where the diameter of the first conductor 20 at the change position is decreased and the microwave is reflected at the change position, it is desirable that a depth of the groove be "$(\lambda/4)+(m\cdot\lambda/2)$." Note that "m" is an integer number of "0 (zero)" or more. In this case, it is necessary to employ, as the first conductor, a conductor having a diameter that makes it possible to provide a groove with such a depth.

In contrast, in a case where an impedance is changed by increasing the diameter of the first conductor 20 at the change position, a groove is not provided at the change position. On this account, it is possible to employ, as the first conductor 20, a conductor having a relatively small diameter. In view of this, in the PCVD device 11 of the present embodiment, the first flange 25 is provided rather than the groove at the change position. Accordingly, by employing, as the first conductor 20, a conductor having a relatively small diameter, it is possible to restrain upsizing of the PCVD device 11.

(4) Further, the second flanges 26 are provided between the first flange 25 and the second connecting portion 24 in the first conductor 20. Hereby, the output wave MWO passing through the first flange 25 and flowing toward the second connecting portion 24 without being reflected by the first flange 25 toward the first-connecting-portion-23 side can be reflected by the second flanges 26. Thus, a plurality of portions that reflects the output wave MWO toward the first-connecting-portion-23 side is provided between the first connecting portion 23 and the second connecting portion 24. This makes it possible to increase an effect of restraining the microwave from leaking toward the direct-current-power-supply-46 side.

(5) The second flanges 26 and the grounded earth electrodes 441 are placed alternately between the first flange 25 and the second connecting portion 24 in the axial direction. A direct current flows through the second flanges 26. That is, a plurality of capacitors is placed in series. By placing the plurality of capacitors along the axial direction as such, it is possible to more effectively restrain the microwave passing through the first flange 25 and flowing toward the second connecting portion 24 from flowing toward the second-connecting-portion-24 side.

(6) The temperature of the workpiece W placed inside the chamber 12 can be detected by the temperature sensor 42 placed inside the first conductor 20. On that account, at the time of depositing a film on the workpiece W, it is possible to control the PCVD device based on the temperature of the workpiece W.

Figure 4:
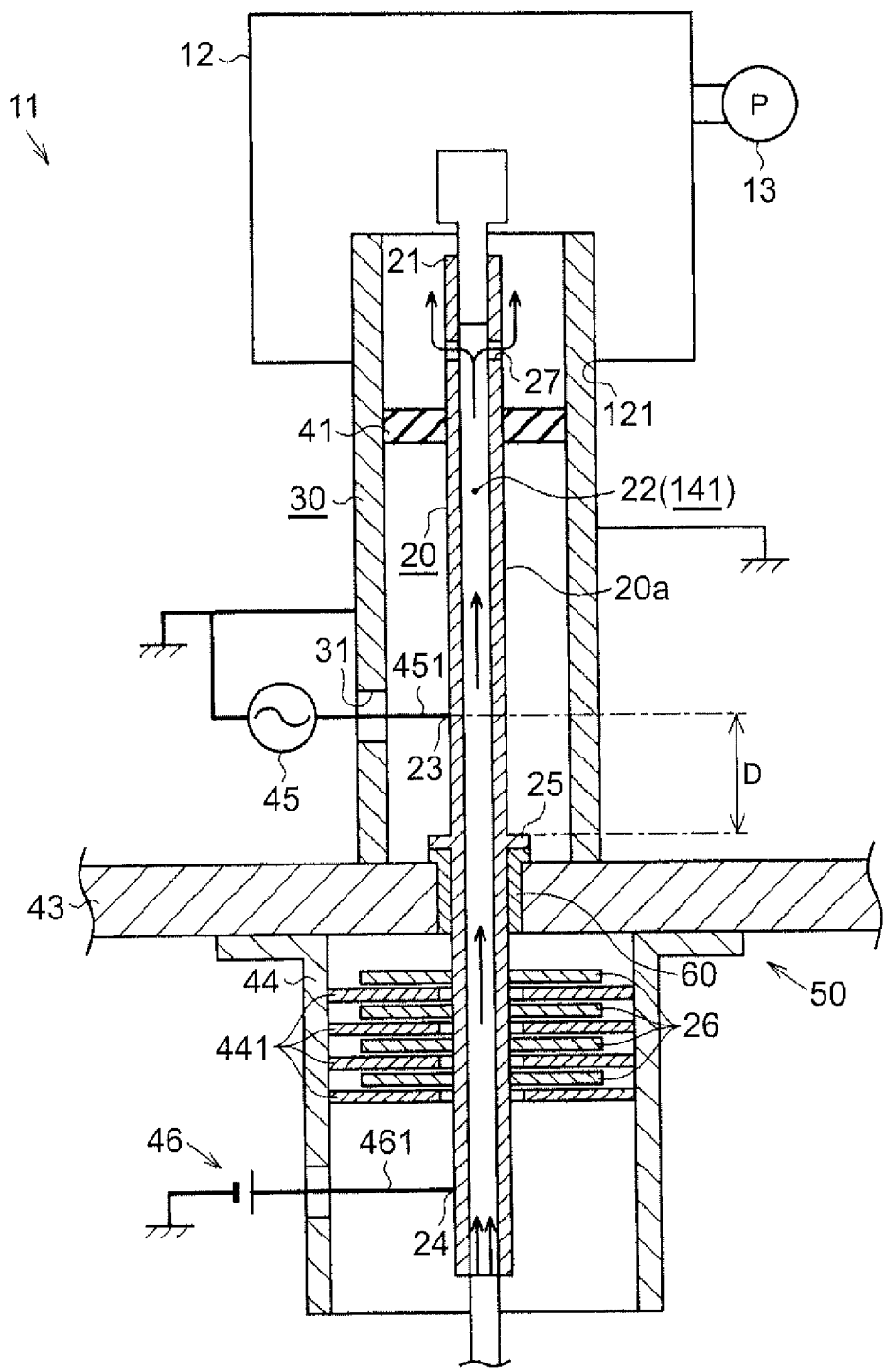
FIG. 4 is a sectional view schematically illustrating another embodiment of the plasma chemical vapor deposition device.

Note that the above embodiment can be modified to the following other embodiments.—In the above embodiment, the first conductor 20 has a hollow structure. More specifically, the first conductor 20 has a tubular shape. Accordingly, as illustrated in FIG. 4, an internal space of the first conductor 20 may function as part of a supply passage 141 of the process gas. In this case, it is desirable to supply the process gas into the first conductor 20 from a bottom end of the first conductor 20 in the figure, and to provide a supply hole 27 on a side wall of the first conductor 20 so as to serve as a communication portion that communicates the internal space 22 of the first conductor 20 with the chamber 12. The side wall of the first conductor 20 is placed on an upper side relative to the sealing member 41 in the figure and placed inside the chamber 12. Hereby, the process gas that has flowed through the internal space 22 of the first conductor 20 is supplied into the chamber 12 through the supply hole 27.

With this configuration, a supply portion of the process gas into the chamber 12 can be placed near the workpiece W. On that account, inside the chamber 12, a concentration of the process gas easily increases near the workpiece W, which is a processing object. This consequently makes it possible to improve efficiency of film deposition on the workpiece W.

In a case where a detection system such as the temperature sensor 42 is not provided in the internal space of the first conductor, the first conductor may be configured in any shape other than the tubular shape. For example, the first conductor may be constituted by a rod-shaped member. In this case, a peripheral surface of the first conductor corresponds to the surface through which the microwave flows. The peripheral surface of the first conductor faces the inner surface of the second conductor 30 via a space.

The earth electrodes 441 may be omitted. Even in this case, it is possible to reflect the microwave by the second flanges 26 toward the first-connecting-portion-23 side.—The number of second flanges 26 to be provided between the first flange 25 and the second connecting portion 24 in the first conductor 20 may be "one."

If the first flange 25 provided at the change position in the first conductor 20 can sufficiently yield the effect of restraining the leakage of the output wave MWO to the direct-current power supply 46, the second flanges 26 may not be provided in the first conductor 20.

If the first flange 25 is provided between the first connecting portion 23 and the second connecting portion 24 in the first conductor 20, the first flange 25 may be placed at a position different from the change position. Even in this case, the output wave MWO flowing from the first connecting portion 23 toward the second connecting portion 24 can be reflected by the first flange 25.

However, in consideration of the efficiency of film deposition on the workpiece W, it is preferable to place the first flange 25 at a position that allows the reflected wave MWR to be generated such that the amplitude of the microwave to be input into the workpiece W becomes larger than that of the output wave MWO.

By changing a diameter of a part of the conductor, it is possible to change the impedance of the conductor. On this account, an annular groove may be provided in a part of the first conductor 20 so that the annular groove serves as the impedance change portion. In this case, it is desirable that a depth of the groove be "$(\lambda/4)+(m\cdot\lambda/2)$." Note that "m" is an integer number of "0 (zero)" or more. Note that such an annular groove may be provided on the outer surface of the first conductor 20 or may be provided on the inner surface thereof.

Similarly, an annular groove may be provided between the change position and the second connecting portion 24 in the first conductor 20 so that the groove serves as another impedance change portion. In this case, it is desirable that a depth of the groove be "$(\lambda/4)+(m\cdot\lambda/2)$." Note that "m" is an integer number of "0 (zero)" or more.

In the PCVD device 11 of the present embodiment, a waveguide is not used to supply the microwave. Accordingly, the PCVD device 11 can be lightweighted in comparison with a device using a waveguide, thereby making it easy to reciprocate the conductors 20, 30 in a direction distanced from the chamber 12 and in a direction approaching the chamber 12. In view of this, the PCVD device 11 may be provided with a movement device for reciprocating the conductors 20, 30, and a preparation room outside the chamber 12. In this case, in a state where the support portion 21 of the first conductor 20 is moved into the preparation room outside the chamber 12, it is possible to remove, from the support portion 21, the workpiece W that has been subjected to film deposition, and it is possible to attach, to the support portion 21, the workpiece W that has not been subjected to film deposition yet. When the workpiece W that has not been subjected to film deposition yet is supported by the support portion 21 and then moved into the chamber 12 from the preparation room, the microwave is input into the workpiece W in this state. Hereby, a film can be deposited on the workpiece W. This accordingly makes it possible to easily achieve automation of film deposition on the workpiece W.

The output portion 451 of the high-frequency output device 45 may be constituted by a conductor, or may be constituted by a waveguide.—If it is possible to improve the efficiency of film deposition on the workpiece W by applying a positive direct voltage to the workpiece W to increase the potential of the workpiece W, the positive direct voltage rather than the negative direct voltage may be applied to the first conductor 20.

The PCVD device 11 of the above embodiment may be embodied as a device that performs film deposition on a plunger of a high-pressure fuel pump for force-feeding fuel for an internal combustion engine. It is needless to say that the PCVD device may be embodied as a device that performs film deposition on a workpiece W other than a component part of such a high-pressure fuel pump.

What is claimed is:

1. A plasma chemical vapor deposition device comprising:
a chamber configured to accommodate a workpiece inside the chamber, the chamber being configured to decompose a process gas by turning the process gas into plasma inside the chamber such that a film is deposited on the workpiece;
a first conductor having an elongated shape, the first conductor being configured such that one end makes contact with the workpiece inside the chamber and the other end is placed outside the chamber;
a second conductor having a tubular shape, the second conductor being placed coaxially with the first conductor such that the first conductor is placed inside the second conductor;
a high-frequency microwave generator connected to the first conductor and the second conductor, the high-frequency microwave generator being configured to cause a microwave to flow through a surface of the first conductor; and
a direct-current power supply configured to output a direct voltage to the first conductor, wherein:
a first connecting portion of the first conductor with the high-frequency microwave generator and a second connecting portion of the first conductor with the direct-current power supply are both placed outside the chamber;
a distance from the one end of the first conductor to the first connecting portion is shorter than a distance from the one end of the first conductor to the second connecting portion; and
an impedance change portion, which is either a flange or an annular groove, is provided between the first connecting portion and the second connecting portion on an outer surface of the first conductor, the impedance change portion having an impedance different from an impedance between the one end of the first conductor and the first connecting portion.

2. The plasma chemical vapor deposition device according to claim 1, wherein:
the impedance change portion is placed at a change position in the first conductor, the change position being a position distanced from the first connecting portion toward a second-connecting-portion side only by a prescribed distance; and
the prescribed distance satisfies a following relational expression:

$$D = \left(n + \frac{1}{4}\right) \times \lambda$$

wherein D indicates the prescribed distance, n indicates an integer number larger than zero, and λ indicates a wavelength of the microwave.

3. The plasma chemical vapor deposition device according to claim 2, wherein
the impedance change portion is configured such that a diameter of the first conductor at the change position is made larger than a diameter of the first conductor on a first-connecting-portion side relative to the change position.

4. The plasma chemical vapor deposition device according to claim 2, wherein
another impedance change portion is provided between the change position and the second connecting portion in the first conductor, the another impedance change portion being either another flange or another annular groove provided on the outer surface of the first conductor.

5. The plasma chemical vapor deposition device according to claim 4, wherein:
the another impedance change portion is a flange provided in the first conductor;
a plurality of another impedance change portions is provided between the change position and the second connecting portion; and
an earth electrode is provided between the another impedance change portions adjacent to each other in an axial direction extending from the one end of the first conductor to the second connecting portion, the earth electrode being a grounded electrode.

6. The plasma chemical vapor deposition device according to claim 1, wherein:
the first conductor is a hollow structure having an internal space; and
a temperature sensor configured to detect a temperature of the workpiece is placed in the internal space of the first conductor.

7. The plasma chemical vapor deposition device according to claim 1, wherein:
the first conductor is a hollow structure having an internal space;
the internal space of the first conductor constitutes a part of a supply passage through which the process gas is supplied to the chamber; and
the first conductor includes a communication portion that communicates the internal space of the first conductor with the chamber.

* * * * *